United States Patent [19]

Alexander, Jr. et al.

[11] Patent Number: 4,871,420

[45] Date of Patent: Oct. 3, 1989

[54] SELECTIVE ETCHING PROCESS

[75] Inventors: Frank B. Alexander, Jr., Totowa; Pang-Dow Foo, Berkeley Heights; Ronald J. Schutz, Warren, all of N.J.

[73] Assignee: American Telephone and Telegraph Company, AT&T Bell Laboratories, Murray Hill, N.J.

[21] Appl. No.: 150,490

[22] Filed: Feb. 10, 1988

Related U.S. Application Data

[63] Continuation of Ser. No. 682,776, Dec. 18, 1984, abandoned.

[51] Int. Cl.[4] .................... H01L 21/306; C03C 15/00
[52] U.S. Cl. ................................... 156/643; 156/345; 204/192.32; 204/298
[58] Field of Search ............... 156/345, 643, 653, 657; 204/192.32, 298

[56] References Cited

U.S. PATENT DOCUMENTS

| | | | |
|---|---|---|---|
| 4,298,443 | 11/1981 | Maydan | 204/192 E |
| 4,397,724 | 8/1983 | Moran | 204/298 X |
| 4,399,016 | 8/1983 | Tsukada et al. | 156/345 X |
| 4,400,235 | 8/1983 | Coquin et al. | 156/643 |
| 4,419,201 | 12/1983 | Levinstein et al. | 156/643 X |
| 4,422,897 | 12/1983 | Horwitz | 156/643 |
| 4,473,455 | 9/1984 | Dean et al. | 204/298 |
| 4,482,419 | 11/1984 | Tsukada et al. | 156/345 |
| 4,534,816 | 8/1985 | Chen et al. | 204/298 X |

OTHER PUBLICATIONS

Mucha, J. A., "The Gases of Plasma Etching-:Silicon-Based Technology", Solid State Technology, Mar. 1985, pp. 123-127.

Primary Examiner—Raymond Hoch
Attorney, Agent, or Firm—Bruce S. Schneider

[57] ABSTRACT

By adjusting the AC field conditions, i.e., by grounding the environment of a substrate being etched with a chlorine-containing plasma, a significant increase in etch selectivity is achieved. By applying a similar AC field adjustment to the reaction chamber surfaces, excellent etch uniformity is achieved in conjunction with excellent selectivity.

7 Claims, 3 Drawing Sheets

SELECTIVE ETCHING PROCESS

This application is a continuation of application Ser. No. 682,776, filed Dec. 18, 1984, now abandoned.

BACKGROUND OF THE INVENTION

1. Field of the Invention

This invention relates to device processing and, in particular, to semiconductor processing.

2. Art Background

The etching of a first material without unacceptably removing or damaging a second is often required in processes such as semiconductor device fabrication procedures. For example, it is desirable in certain situations, such as in the production of appropriately configured gates, to remove a region of silicon and/or metal silicide without causing unacceptable removal of an underlying or adjacent region of a silicon oxide, e..g, silicon dioxide. Processes such as plasma etching and reactive ion etching employing a chlorine-containing gas are often utilized to accomplish these results. In these techniques, a chlorine-containing gas is typically introduced in proximity to the body to be etched, and a plasma is established in the gaseous medium by applying r.f. power between electrodes. Typically, the substrate rests on the powered electrode, and the DC electric field associated with this electrode directs the energetic entities produced in the plasma (e.g., ionized molecular fragments, ionized molecules, and ionized atoms) towards the substrate and, through various mechanisms, causes removal of the impacted material.

A variety of etching apparatus geometries and processing conditions has been employed in the dry etching of materials such as silicon. The specific configuration and etching conditions are generally chosen to yield etching characteristics tailored to the particular semiconductor device fabrication application. For example, a hex reactor, e.g., an apparatus disclosed in U.S. Pat. No. 4,298,443, issued Nov. 3, 1981 (which is hereby incorporated by reference), and illustrated in the Figures of this patent, is capable of processing a large number of substrates during one etching procedure. This reactor includes a hexagonally shaped cathode contacting the substrates and typically a grounded outer shell that functions as the second electrode. A plurality of substrates is positioned on each face of the hexagonal cathode. Thus, for example, if 4 substrates are placed on each face, it is possible to process 24 substrates during one etching procedure. Alternatively, parallel plate reactors, i.e., reactors having a cathode and anode each formed by a plate whose major surfaces are held in a parallel configuration, have been advantageously employed in less demanding applications to provide suitable simultaneous etching of 4 to 6 substrates. In a third type of reactor, one substrate covers essentially the entire r.f. driven electrode, and a second electrode, e.g., a parallel plate or vessel component, is provided.

While in many situations etching involving plasma-generated energetic entities is advantageously employed, it is not without associated difficulties. For example, the use of a plasma often leads to the deposition of contaminating materials on the substrate surface. These contaminating materials such as metals from the reaction vessel or substrate holder, e.g., aluminum, either degrade device properties or hinder subsequent processing procedures. Various measures have been employed to avoid such contamination. For example, in the case of a hex reactor, a tray surfaced with a material, e.g., a polymer such as a polyarylate, is positioned on each face of the hex cathode with openings through which the substrates are inserted. Thus, the substrates contact the underlying electrode while remaining exposed to the plasma environment.

Although as presently practiced, dry etching yields excellent results with limited shortcomings, new applications have produced further, yet unsatisfied, demands. For example, there are many applications of emerging importance that require the removal of materials such as silicon with the effect on adjacent, e.g., underlying or coplanar, materials such as silicon dioxide substantially reduced from that which has been previously achieved. For typical etching systems, selectivity, i.e., the rate of etching of the desired region relative to underlying or unmasked adjacent regions of different compositions, is not greater than 30 to 1. However, as packing density in electronic devices, e.g., integrated circuits, increases, many situations are evolving which require selectivities of at least 50, preferably at least 70, and most preferably at least 100 to 1. For example, in the etching of $TaSi_2$/polycrystalline silicon composite gates, selectivity on the order of 100 to 1 is required to assure that the thin oxide, less than 250 Angstroms thick, which is used as an etch stop will not be totally removed.

Despite the substantially increasing desire for higher selectivity, the adjusting of dry etching apparatus configuration and processing conditions to achieve such results has not been reported. Indeed, in the dry etching of materials employed in semiconductor devices, often the adjusting of conditions or configurations to achieve one result causes a substantial problem in a second unrelated etching characteristic. Thus, although there is a desire for selective, plasma dry etching procedures, i.e., procedures involving a gas plasma with selectivities greater than 50, such techniques have not as yet been reported.

SUMMARY OF THE INVENTION

The selectivity produced for materials etched by chlorine entities is significantly increased by substantially attenuating the AC electric field present in regions laterally adjacent to the substrate deposition surface and thus confining the plasma to the region directly over the substrates. For example, by AC coupling the substrate surroundings to ground, the selectivity of chlorine plasma etching between silicon and silicon dioxide is increased to as high as 150 to 1. By attenuating the AC field in all etching chamber surface regions subjected to the gas in which the plasma is struck, extremely uniform etch rates across the entire substrate are achieved. Additionally, if the substrate surroundings are not DC coupled to ground, it is possible, by adjusting the DC potential, to enhance this etch uniformity even further. Thus, the adjusting of electrical field conditions such as by AC coupling to ground does not degrade other properties, e.g., etch uniformity, associated with the etching procedure.

DETAILED DESCRIPTION

Figure 1:
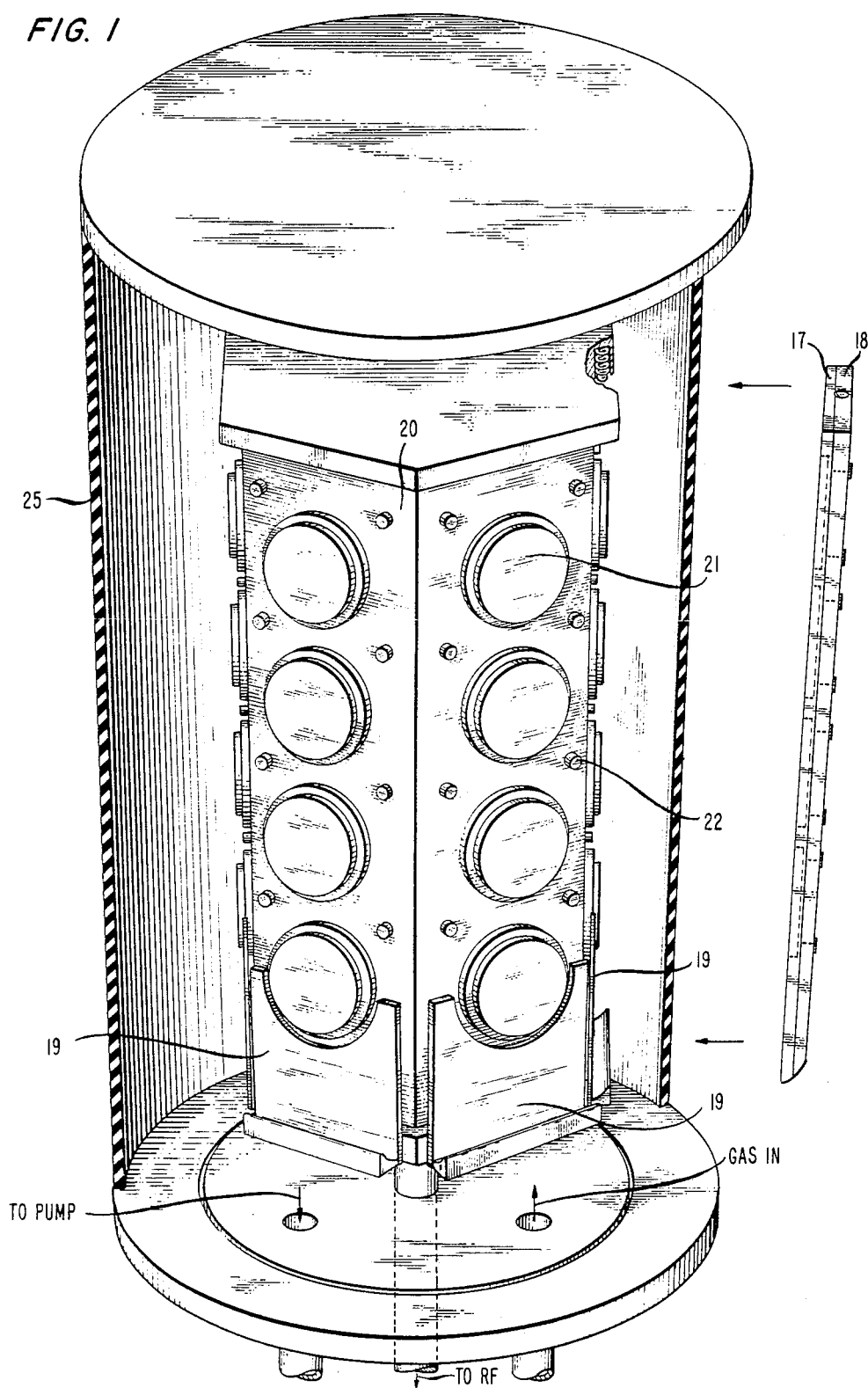
FIGS. 1–6 are illustrative of conditions and configurations affecting the procedure.

The invention is not limited to a particular plasma etching apparatus geometry. For example, excellent selectivity is achievable in both parallel plate and hex configurations. Irrespective of the particular geometry employed in the plasma etching apparatus, to achieve high selectivity, the plasma should be confined essentially to the region overlying the substrate deposition surface. (Although for pedagogic purposes the disclosure will be in terms of the etching of one substrate, the same disclosure is equally applicable to multiple substrate etching by the confinement of the plasma for each substrate to the region over this substrate. Thus, for example, if three substrates are etched, then there would be three distinct plasma regions, with one of these regions confined over each substrate.) In the context of this invention, the region overlying the substrate etching area is the spatial region defined by normals to all points on the substrate etching surface. The plasma is suitably confined if on average it does not extend a distance more than 10 percent of the substrate effective diameter beyond the boundaries of this substrate etching region. (The substrate effective diameter is the diameter of a circle having the same area as that of the substrate.) This confinement criterion is satisfied if at least 70 percent of the plasma emitted light in the wavelength range 3900 to 8000 Angstroms emanates from points within the desired confinement volume. Confinement is achieved by limiting AC electric field outside the region in which it is desired to confine the plasma. A variety of expedients is available for suitably limiting the AC field. For example, the surfaces surrounding the substrate are capacitively coupled to ground so that the capacitance to ground is significantly, e.g., at least 5 times, greater than the capacitance between this surface and the r.f. driven cathode. In this embodiment, the AC field is attenuated because these two capacitances act as a voltage divider between the r.f. cathode and ground. The large capacitance to ground has the smaller impedance. Thus, the surfaces surrounding the substrate are significantly closer to ground potential than the r.f. cathode. This low potential results in correspondingly low electric fields.

Capacitive coupling can be accomplished in a variety of ways. For example, if a grounded region contacts the back surface of the metal reactor tray over a large area, then the capacitive coupling of the tray to ground will be much greater than the capacitive coupling of the tray to the r.f. driven cathode. (In this case, the tray will also be DC coupled to ground.)

Alternatively, to attenuate the AC electric field, it is possible to surround the substrate with a thick dielectric material, e.g., a material with a thickness greater than 0.125 inch, preferably thicker than 0.5 inch, for compositions with dielectric constants above 2.5. In this configuration, the surface of the dielectric which is exposed to the reactor volume is only weakly capacitively coupled to the r.f. driven cathode and capacitively coupled to ground only through the plasma. The dielectric material attenuates the AC field by, for example, (1) increasing the distance from the source of the field to the surface subjected to the etchant gas, (2) by dielectric dissipation of the field through movement of dipoles in the dielectric, and (3) through a voltage divider effect where the capacitance of the plasma is sufficiently large to substantially decrease the potential and thus the field at the surfaces surrounding the substrate.

When expedients such as capacitively grounding the environment of the substrate or insulating it with a thick dielectric are performed, the plasma is confined to regions essentially directly over the substrates. Regions between the substrates are not subjected to the plasma fireball. Thus, material between the substrates is not eroded by mechanisms such as sputtering, and contamination of the substrates by surrounding materials is substantially decreased. Even more significantly, as discussed, selectivity is substantially increased. Although the exact mechanistic explanation for the increase in selectivity is not precisely known, it is contemplated that the confined plasma discharge substantially enhances the production of molecular ions at the expense of atomic ions. Thus, in the case of a chlorine-containing plasma, the presence of ions such as $Cl_2^+$ is substantially increased at the expense of the concentration of ions such as $Cl^+$.

As discussed, by confining the plasma to the region above the substrate, excellent selectivity is achieved. With confinement alone, the etch rate across the substrate is somewhat non-uniform, e.g., etch rates vary by up to 35 percent. It is, however, possible to eliminate this non-uniformity. Uniformity is achieved by ensuring that all surfaces in the reaction chamber subjected to the etchant gas are AC field controlled in the same manner as required for the substrate environment by the confinement criterion, i.e., that the plasma is removed from these surfaces a distance of at least 20 percent of the substrate effective diameter. For example, the metal bell jar container, 25 in FIG. 1, forming the reaction chamber is capacitively coupled to ground by, for example, providing large-area conductive paths to ground. Although this expedient yields the desired results, the metal bell jar is a possible source of contamination. Thus, it is advantageous to internally coat it with a continuous glass layer that is sufficiently thin to suitably attenuate the electric fields, e.g., a glass layer on the order of 0.06 inch in thickness. The AC grounding attenuates the AC field and leads to etch rate variations across the substrate no greater than 15 percent. Although AC grounding of the metal bell jar has been found to be an expeditious procedure for achieving suitable attenuation, any other means for satisfying the AC field attenuation criterion, such as those described in conjunction with plasma confinement, is adequate.

Uniformity is further improved, although not as dramatically, by adjusting the DC bias of the substrate environment to the DC bias level of the substrate. A variety of expedients is available for adjusting the DC potential level of the substrate environment. For example, this variation is achieved by utilizing a variable DC power supply with a continuous conductive path from the supply to the substrate environment.

The elimination of the non-uniformity is significant not only in conjunction with the inventive improvement in selectivity, but also significant in other configurations where the environment of the substrate is not at DC ground or where AC fields at the surface of the reaction chamber are not suitably controlled. Most significantly, uniformity, i.e., a mean square deviation in etch rate across the substrate of less than 4 percent, is achieved without adversely affecting selectivity.

The following examples are illustrative of the invention:

EXAMPLE 1

A silicon substrate measuring 3 inches in diameter having its major surface in the (100) crystallographic plane was cleaned and oxidized at 1000 degrees C. in oxygen to yield a 1000-Angstrom thick silicon dioxide layer. Four thousand Angstroms of polycrystalline silicon was deposited onto this silicon dioxide layer utilizing a low pressure chemical vapor deposition (LPCVD) procedure with a deposition gas of silane and with the substrate heated to a temperature of approximately 600 degrees C. (This LPCVD procedure is fully described in "Low Pressure CVD Production Processes for Poly, Nitride and Oxide," by R. S. Rosler, *Solid State Technology*, Vol. 20, page 63 (April 1977).)

Figure 2:
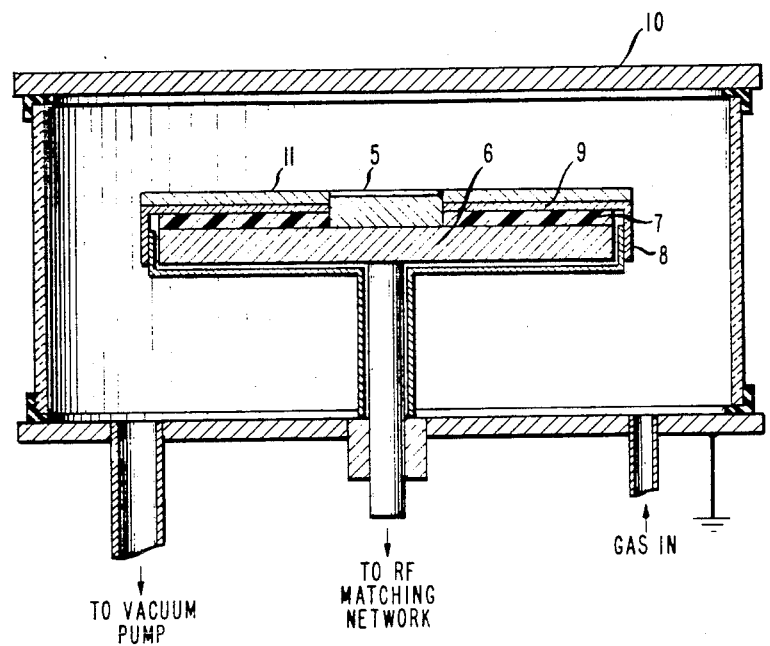

The sample was placed in position 5 of FIG. 2 on the driven electrode, 6, of a reactive ion etching apparatus. The driven electrode, 6, had an overlying Teflon (a registered trademark of E. I. duPont deNemours & Co., Inc.) sheet, 7. The addition of an aluminum plate, 9, overlying the Teflon sheet was inserted to allow capacitive grounding through wing, 8, of this sheet. Finally, an Ardel (a registered trademark of Union Carbide Corporation) sheet, 11, 1/8th-inch thick, overlaid the aluminum plate. A counterelectrode, 10, which was 18 inches in diameter, was positioned approximately 4 inches from the exposed major surface of the sample. The etching chamber was evacuated to a pressure of approximately $1 \times 10^{-5}$ Torr. A $Cl_2$ flow rate of 20 sccm was established through the reactor chamber. The vacuum pumping speed was then diminished so that the $Cl_2$ pressure in the chamber increased to 20 mTorr. An r.f. power of 9 watts was applied to the driven electrode at a frequency of 13.56 MHz. The resulting etch rate of the exposed polycrystalline silicon layer, as measured with a laser interferometer, was 200 Angstroms/minute. After the polycrystalline silicon layer was removed, as indicated by the interferometer, etching was continued into the exposed oxide for 30 minutes. This etching resulted in an oxide removal rate of 2.2 Angstroms/minute which, when compared with the polycrystalline silicon etch rate, yielded a selectivity of 90 to 1.

EXAMPLE 2

The procedure of Example 1 was followed except two separate runs utilizing 14 watts and 20 watts, respectively, of applied r.f. power were performed. These runs yielded a polycrystalline silicon etch rate of 400 and 457, respectively, and an oxide etch rate of 6.2 and 10.6, respectively, and thus a respective selectivity of 65 to 1 and 43 to 1.

EXAMPLE 3

Figure 3:
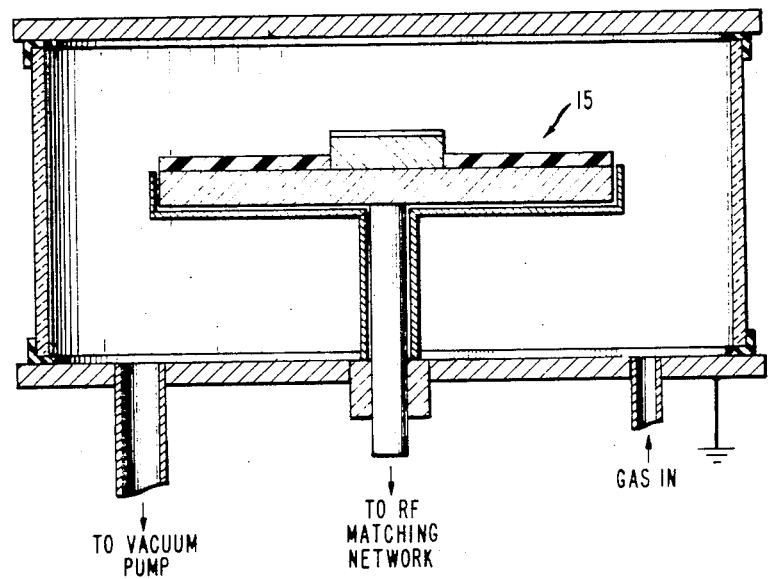

The procedure of Example 1 was followed except the substrate was placed on a pedestal attached to a driven electrode, and only a 1/8th-inch thick Ardel sheet, 15, overlaid this electrode, as shown in FIG. 3. As can be seen in Table 1, various r.f. powers were applied yielding selectivities significantly lower than those obtained for the corresponding etching conditions in the previous Examples.

TABLE 1

| R.F. | Poly-Si | Oxide | Selectivity |
|------|---------|-------|-------------|
| 9 W  | 80      | 1.4   | 57:1        |
| 14 W | 133     | 3.3   | 40:1        |
| 20 W | 210     | 8.4   | 25:1        |

EXAMPLE 4

Figure 5:
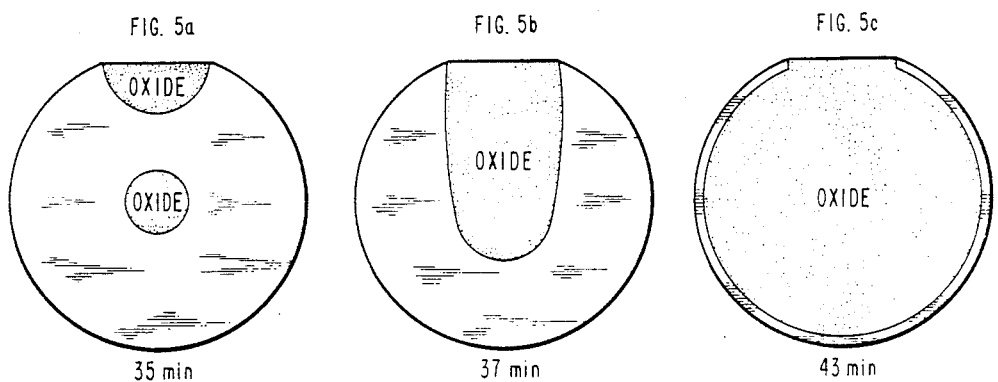

Samples with a polycrystalline silicon and silicon dioxide layer were prepared, as described in Example 1. These samples were placed on the driven electrode of a hexagonally configured cathode RIE reactor. (This reactor is described in U.S. Pat. No. 4,298,443, issued Nov. 3, 1981.) The reactor was modified, as shown in FIG. 1, to have an aluminum tray, 17, with Ardel outer plates, 18, having cutouts of a size slightly larger than the individual substrates contacting grounded plate, 19. The grounded plate was set off from the driven electrodes, 20, and pedestals, 21, utilizing Teflon insulating spacers, 22. The bell jar, 25, was grounded and had an internal glass coating that was 0.09 inch in thickness. Each substrate position not occupied by a sample having both a polycrystalline silicon and silicon dioxide layer was occupied by a silicon substrate covered with resist to avoid exposure of the aluminum pedestal. The chamber was evacuated to a pressure of approximately $1 \times 10^{-5}$ Torr. A molecular chlorine flow through the chamber was established at a rate of 40 sccm. The pumping speed of the vacuum pump was then decreased so that the pressure in the chamber rose to approximately 20 mTorr. An r.f. power of approximately 70 watts at a frequency of 13.56 MHz was applied to the driven electrode. The etch rates of the polycrystalline silicon and silicon dioxide were measured as described in Example 1. The polycrystalline silicon etched at a rate of approximately 96 Angstroms/minute, the silicon dioxide etched at a rate of approximately 0.94 Angstrom/minute, and thus the selectivity was approximately 90 to 1. The profiles obtained as the etching reached the polycrystalline silicon/silicon dioxide layer interface are shown in FIG. 5 as an indication of the achieved etch rate uniformity.

EXAMPLE 5

Figure 4:
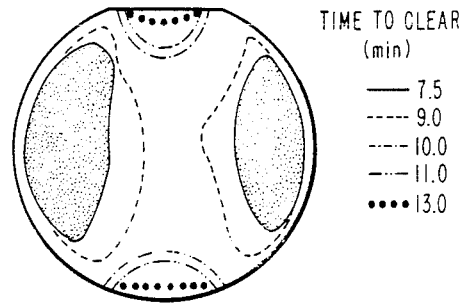

The procedure of Example 4 was followed except the r.f. power was approximately 100 watts, and the bell jar was entirely a glass composition. A grounded grid of aluminum enclosed this glass bell jar. The relatively non-uniform profiles obtained as the etchant reached the interface between the polycrystalline silicon and silicon dioxide layers are shown in FIG. 4.

EXAMPLE 6

Figure 6:
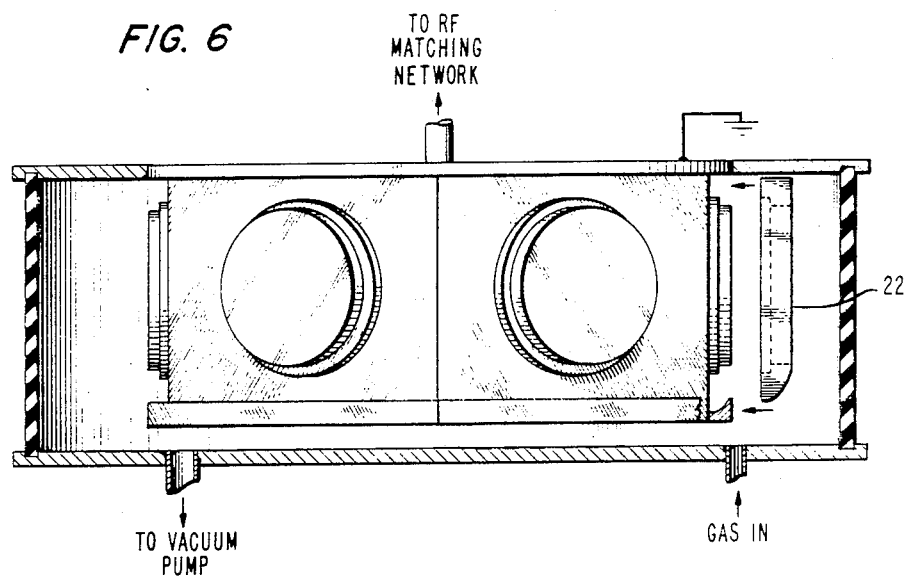

The procedure of Example 4 was followed except the hexagonal cathode was only one tier high, as shown in FIG. 6, and thus accepted only one substate per face of the hexagonal electrode. Additionally, the grounding metal plate was not present, and only a tray of Ardel, 22, 0.5 inch in thickness, surrounding the substrate and abutting the hexagonal cathode was utilized. The applied power was 24 watts, and the initially established chlorine flow rate was 30 sccm. The polycrystalline silicon etch rate was 230 Angstroms/minute, the silicon dioxide etch rate was 3.1 Angstroms/minute, and thus the selectivity was approximately 74 to 1.

What is claimed is:

1. A process for fabricating a device comprising the steps of (1) in a vessel, etching a first material of a substrate by contact with chlorine-containing entities from a gas plasma while a second material of said substrate is also, during said etching, subjected to said entities; and (2) completing said device
    characterized in that
    said plasma is confined to a region that extends laterally from the periphery of said substrate a distance less than 20 percent of the effective diameter of said substrate, wherein said second material is substantially unaffected by said etching and wherein said confinement is accomplished by capacitively coupling the vicinity of said substrate to ground.

2. The process of claim 1 wherein said second material is a silicon oxide and said first material is silicon.

3. The process of claim 2 wherein said etching is accomplished in a reactor utilizing a hexagonal cathode to produce said plasma.

4. The process of claim 2 wherein said etching is accomplished in a reactor utilizing parallel electrodes to form said plasma.

5. The process of claim 2 wherein said plasma is confined to a region that is removed a distance of at least 20 percent of said substrate effective diameter from the surface of said vessel.

6. The process of claim 5 wherein the inner surfaces of said vessel are coated with a glass.

7. The process of claim 1 wherein said plasma is confined to a region that is removed a distance of at least 20 percent of said substrate effective diameter from the surfaces of said vessel.

* * * * *